United States Patent [19]
Burns

[11] 4,363,068
[45] Dec. 7, 1982

[54] POWER FET SHORT CIRCUIT PROTECTION

[75] Inventor: Dennis A. Burns, Ramsey, Minn.

[73] Assignee: Sundstrand Corporation, Rockford, Ill.

[21] Appl. No.: 179,347

[22] Filed: Aug. 18, 1980

[51] Int. Cl.³ .............................................. H02H 3/20
[52] U.S. Cl. ................................. 361/91; 307/200 B; 361/100
[58] Field of Search ........................ 361/91, 92, 93, 94, 361/100, 101; 330/207 P, 298; 307/200 A, 300, 200 B

[56] References Cited

U.S. PATENT DOCUMENTS

| | | | |
|---|---|---|---|
| 3,493,878 | 2/1970 | Fautale | 330/298 |
| 3,845,405 | 10/1974 | Leidich | 330/207 P |
| 3,864,642 | 2/1975 | Long et al. | 330/207 P |
| 4,127,887 | 11/1978 | Tanaka et al. | 361/86 |
| 4,158,866 | 6/1979 | Baker | 361/92 X |
| 4,186,418 | 1/1980 | Seiler | 361/91 |
| 4,293,888 | 10/1981 | McCarty | 361/100 X |

*Primary Examiner*—Reinhard J. Eisenzopf
*Attorney, Agent, or Firm*—Ted E. Killingsworth; Michael B. McMurry; James A. Wanner

[57] ABSTRACT

A protection circuit for a semiconductor device such as a field effect transistor is disclosed having an oscillator which is connected to both the gate turn on circuitry and to the drain-source circuit of the field effect transistor for sensing the voltage of the drain-source circuit and for turning off cyclically the field effect transistor upon the simultaneous occurrence of a gate turn on signal to the gate of the transistor and high drain-source voltage.

8 Claims, 2 Drawing Figures

POWER FET SHORT CIRCUIT PROTECTION

BACKGROUND OF THE INVENTION

This invention relates to the protection of semiconductor devices, particularly field effect transistors, should they be required to dissipate excessive power such as may be developed when the load being controlled by the device or field effect transistor has become short circuited.

A power field effect transistor is typically a VMOS device having gate, drain and source electrodes. In a usual application, a load is connected between a source of voltage and the drain electrode, the source electrode is connected to return and the gate electrode receives typically 10 volts DC for reducing the drain to source resistance from a high value to a low value thus allowing energization of the load.

If a field effect transistor is required to dissipate too much energy or power when it is turned on, the large current flow and large voltage will cause burning of the semiconductor material which, of course, leads to the destruction of the device. Such excessive power can result, for example, from a shorted load where the voltage from the voltage source is applied directly to the drain terminal. Under such conditions, when the field effect transistor is gated on and the load is short circuited, the voltage at the drain terminal of the field effect transistor reamins high but the transistor also begins conducting current. The large current flowing through the transistor and full voltage being applied to the drain terminal of the transistor produces a large amount of power which the transistor must dissipate. Since current is flowing through the transistor and source voltage is being applied to the drain of the transistor, the transistor is incapable of dissipating so much power and the transistor will be destroyed.

Typical prior art approaches for preventing such destruction of field effect transistors include a fuse in series with the load which will open circuit whenever the current flowing therethrough becomes too large. However, such a protection device is inadequate because it both limits the current capabilities of the circuit and requires replacement when it open circuits. Latching type limit devices are also known which will turn the FET off whenever the FET is required to dissipate excessive power. However, because this type of limit is a latching device, it must be manually reset whenever it is required to function. Finally, power limiting resistors are sometimes connected in series with the drain-source circuit of the field effect transistor which limits power but also limits the voltage which can be applied to the load. The present invention protects field effect transistors without requiring a manual reset and without limiting the voltage applied to the load during normal operation.

SUMMARY OF THE INVENTION

The present invention protects a semiconductor device, which typically may be a field effect transistor connecting a load to a source of voltage, by providing an oscillator circuit which will cyclically operate the field effect transistor whenever the drain-source voltage of the transistor during turn on conditions exceeds a predetermined value.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
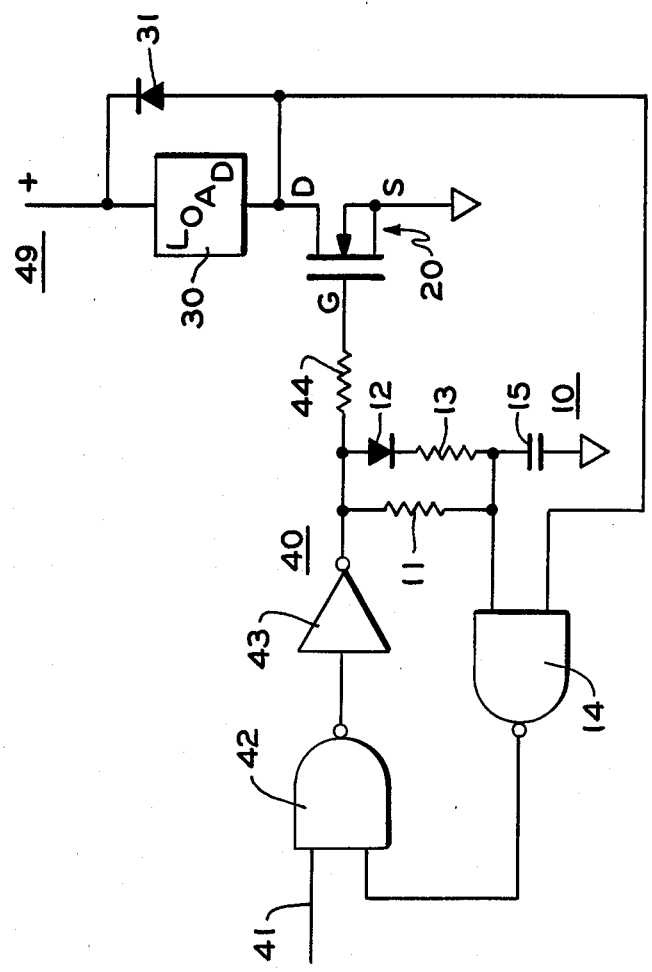
FIG. 1 is a simplified schematic diagram which shows the essence of the invention.

The circuit shown in FIG. 1 includes a protection circuit 10 for protecting field effect transistor 20 whenever it is required to dissipate excessive power such as may be generated when load 30 is short circuited connecting source 49 directly to the drain of field effect transistor 20 whenever gating circuit 40 requires field effect transistor 20 to turn on.

A gate turn on signal is received over terminal 41 and is supplied to one input of NAND gate 42. Terminal 41 is normally low and is raised to a high level whenever field effect transistor 20 is to be turned on to energize load 30. The output of NAND gate 42 is connected through inverter 43 and then through resistor 44 to the gate terminal of field effect transistor 20. The output of inverter 43 is also connected through resistor 11 and through the series connection of diode 12 and resistor 13 to one input of NAND gate 14. That input of NAND gate 14 is also connected to ground through capacitor 15. The output of NAND gate 14 is connected to the second input of NAND gate 42. A second input of NAND gate 14 is connected to the drain terminal of FET 20 and a diode 31 is connected across load 30 for dissipating the energy stored in load 30 when it is an inductive load and is de-energized.

Terminal 41 may be connected to any type of device which controls the conduction of FET 20. As an example, terminal 41 can be provided with an input from a tilt responsive switch such as that shown in copending Pat. application Ser. No. 136,183 filed on Mar. 31, 1980. With the input 41 to NAND gate 42 low, its output is high and the output of inverter 43 is low maintaining FET 20 in its off condition. When FET 20 is off, its drain terminal has substantially supply voltage thereon which results in the input to NAND gate 14 connected from the drain of FET 20 being high, but since the other input to NAND gate 14 from the output of inverter 43 is low, its output must be high which places a high on the second input of NAND gate 42. Since the second input of NAND gate 42 is high, NAND gate 42 will switch when a high signal is received at terminal 41.

Thus, when it is desired to gate FET 20 on, a high singal is placed on terminal 41 which switches the output of NAND gate 42 to a low level which raises the output of inverter 43 to a high level and turns on FET 20. At the same time, the high output from inverter 43 begins charging capacitor 15. However, before capacitor 15 charges to a level which would have switched NAND gate 14, the conduction of FET 20 reduces its drain voltage which lowers the corresponding input to NAND gate 14 for maintaining its output at a high level. With the output of NAND gate 14 still high, NAND gate 42 is conditioned to switch back to its original state when output terminal 41 receives a low input signal.

If load 30 has a short circuit thereacross, however, the drain terminal voltage, as well as the corresponding input voltage to NAND gate 14, will remain high when the output of inverter 43 switches high to cause conduction of FET 20. The current flowing through the drain terminal of transistor 20 will saturate to a relatively constant level that is determined by gate voltage, supply voltage, substrate temperature and transistor geometry. Thus, when capacitor 15 charges through resistors 11 and 13 and diode 12 to a sufficient level, the output of NAND gate 14 will now switch low to raise the output of NAND gate 42 and lower the output of inverter 43. When capacitor 15 has discharged sufficiently through resistor 11, the input to NAND gate 14 connected to capacitor 15 will revert to its zero level which will raise its output to switch the output of NAND gate 42 to a low level for raising the output of inverter 43 to gate on transistor 20. Capacitor 15 will again charge until NAND gate 14 and 42 and inverter 43 again switch. When the output of inverter 43 goes low, FET 20 turns off and capacitor 15 begins to discharge through resistor 11. By properly selecting resistors 11 and 13, the duty cycle of FET 20 during load short circuit conditions will cause cyclical operation with the off time much greater than the on time.

Thus, the load circuit is periodically sampled to determine whether or not the short circuit condition has corrected itself or otherwise been terminated.

Figure 2:
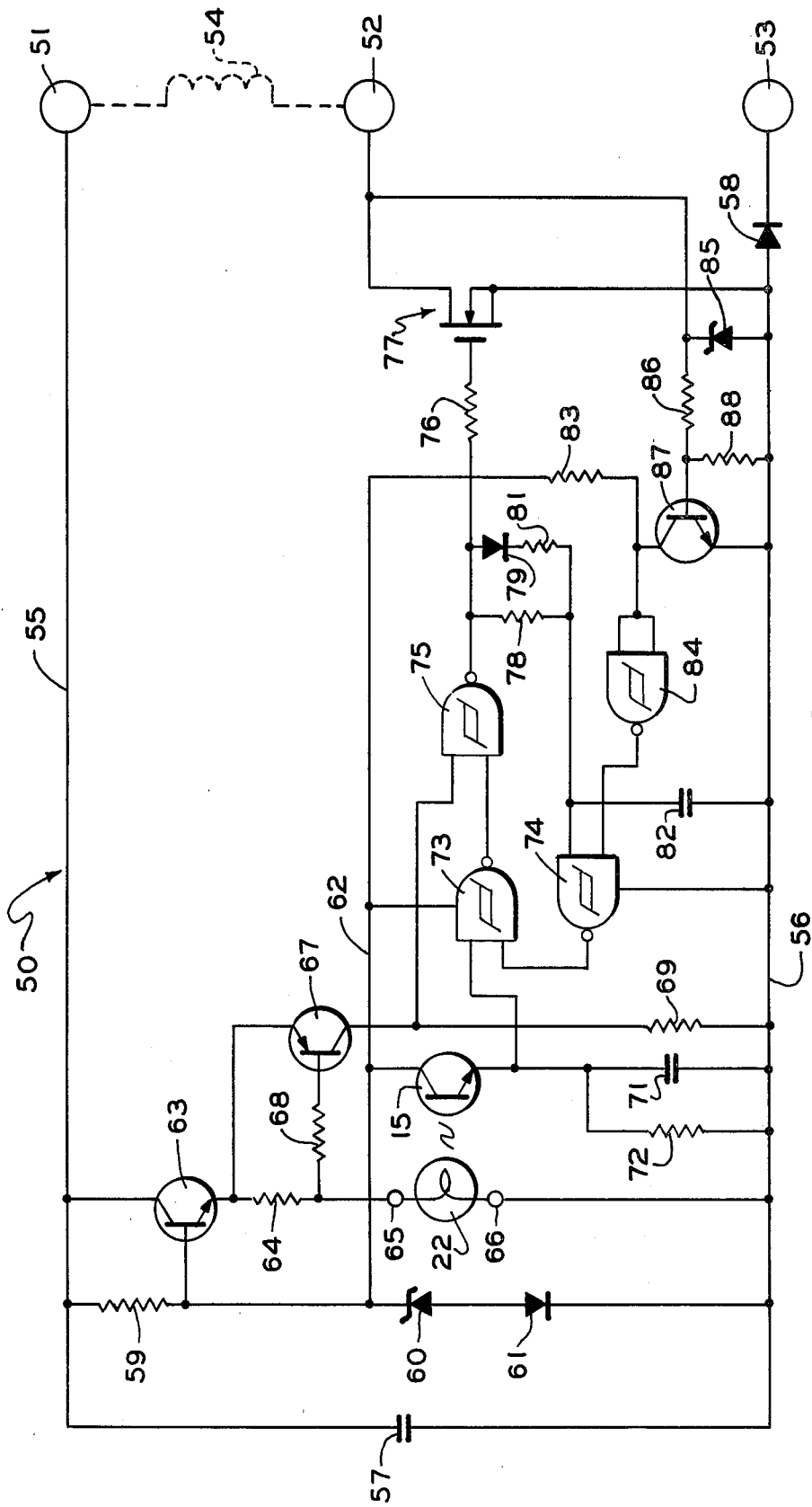
FIG. 2 is a detailed schematic diagram of the invention.

The schematic diagram of FIG. 2 discloses a circuit which provides a feature for selecting the drain voltage level at which the field effect transistor will be cycled and includes further features which are directed to the type of optical tilt alarm sensing arrangement shown in the aforementioned patent application. Indeed, the circuit shown in FIG. 2 is also described in that patent application.

The circuit shown in FIG. 2 is provided with terminals 51, 52 and 53 for supplying power to circuit 50 and for connection to the relay coil shown in phantom at 54 which will energizes a load such as an alarm device as indicated in the aforementioned patent. Line 55 is connected directly to terminal 51 and line 56 is connected to terminal 53 through diode 58 thus establishing line 56 at a one diode voltage drop above terminal 53.

Connected across lines 55 and 56 is a voltage regulator comprising capacitor 57 and the series connection of resistor 59, zener diode 60 and diode 61 connected in parallel to capacitor 57. Zener diode 60 establishes a predetermined voltage level on line 62. Also forming a part of the voltage regulator is NPN transistor 63 having its base connected to the junction of resistor 59 and zener 60, its collector connected directly to line 55 and its emitter connected to line 56 through resistor 64 and terminals 65 and 66. Lamp 22 is adapted to be connected between terminals 65 and 66.

Lamp monitoring PNP transistor 67 has its emitter connected to the emitter of transistor 63 and its base connected through resistor 68 to the junction of resistor 64 and terminal 65. The collector of transistor 67 is connected to line 56 through resistor 69. Transistor 67 forms an open lamp monitor. If the lamp burns out and thus opens circuits, the emitter to base voltage of transistor 67 will reduce to essentially zero and will cause a load activation and an indication that the device is no longer functional.

Photoresponsive transistor 15 receives light from lamp 22 an is used to control the gating on of the load connected between terminals 51 and 52. Photoresponsive transistor 15 has its collector connected to line 62 and its emitter connected to line 56 through the parallel arrangement of capacitor 71 and gain-sensitivity resistor 72 which forms a delay network so that momentary fluctuations in light from lamp 22 to photoresponsive transistor 15 will not result in load actuations.

The gate control circuitry takes the form of NAND gate 73 which has one input connected to the emitter of photoresponsive transistor 15 and a second input connected to the output of NAND gate 74. The output of NAND gate 73 is connected to one input of NAND gate 75 which has its other input connected to the collector of transistor 67. The output of NAND gate 75, which is in the form of a Schmitt trigger because of its hysteresis, is connected through resistor 76 to the gate terminal of FET 77 and is also connected to an oscillating circuit which senses the drain voltage of FET 77 for cyclically operating FET 77 on and off when FET 77 receives a gate turn on signal from NAND gate 75 and at the same time has a high drain voltage because of a substantially short circuit condition across load 54. Thus, the output of NAND gate 75 is connected through resistor 78 which is connected in parallel with the series circuit of diode 79 and resistor 81 to an input of NAND gate 74. This input of NAND gate 74 is also connected to line 56 through capacitor 82.

Line 62 is connected through resistor 83 and inverter 84 to the other input of NAND gate 74. The drain of FET 77 is connected to terminal 52 and is also connected through diode 85 to line 56, and the source and substrate of FET 77 are connected directly to line 56. Terminal 52 is also connected through resistor 86 to the base of NPN transistor 87 and the base of transistor 87 is connected to line 56 through resistor 88. The collector of transistor 87 is connected to the input of inverter 84 and the emitter of transistor 87 is connected to line 56.

In operation, when light does not fall upon photoresponsive transistor 15 from lamp 22, the emitter of transistor 15 is low. A low at the corresponding input to NAND gate 73 insures that its output is high. Since the collector of transistor 67 is also high indicating that lamp 22 is functioning properly, the output of NAND gate 75 is low, FET 77 is off, and load 54 is denergized. The low output from NAND gate 75 means that the corresponding input to NAND gate 74 is low. Since output terminal 52 is at essentially the same voltage as output terminal 51, transistor 87 is on which grounds the input to inverter 84 causing its output to be high. The output of NAND gate 74 is high which enables NAND gate 73 to change its state if phototransistor 15 becomes conductive.

When light is allowed to shine from lamp 22 to photoresponsive transistor 15, transistor 15 will begine to conduct which will cause the corresponding input to NAND gate 73 from the emitter of transistor 15 to go high. Because the other input to NAND gate 73 from NAND gate 74 is high, the output of NAND gate 73 will go low which will raise the output of NAND gate 75 to energize transistor 77 dropping the voltage on terminal 52. When the output of NAND gate 75 goes high, the corresponding input to NAND gate 74 will not go high until capacitor 82 charges sufficiently through resistors 78 and 81 and diode 79. However, before capacitor 82 charges sufficiently, terminal 52 has its voltage lowered which turns off transistor 87 to allow the input to inverter 84 to go high and its output to go low maintaining the high output of NAND gate 74 regardless of the condition of capacitor 82. Since the output of NAND gate 74 is high, NAND gate 73 is enabled to turn off transistor 77 whenever the emitter of transistor 15 goes low.

If for some reason terminals 51 and 52 become shorted, transistor 77 when it is gated on will be required to handle both high voltage and high current. The high power resulting from the high current flowing through it in the high voltage applied acorss its drain-source circuit can damage it. Thus, if a substantial short exists between terminals 51 and 52 and if the output from NAND gate 75 is raised to gate FET 77 on, terminal 52 will remain high and not allow transistor 87 to turn off. With transistor 87 still conducting, the input to inverter 84 remains low and its output remains high so that after the time delay established by capacitor 82 and the resistor-diode network, the output from NAND gate 74 will go low, raising the output from NAND gate 73 and lowering the output of NAND gate 75 turning off FET 77. Since the output of NAND gate 75 is low, capacitor 81 will begin discharging through resistor 78 and, after it has discharged sufficiently, the corresponding input to NAND gate 74 is lowered, thus raising the output of NAND gate 74 to lower the output of NAND gate 73 and to raise the output of NAND gate 75, reenergizing transistor 77. When capacitor 82 has charged sufficiently, NAND gate 74 will again turn off thus providing for cyclical operation of FET 77.

Capacitor 82 charges through the combination of resistors 78 and 81 but discharges through only resistor 78. If resistor 78 is made much larger than resistor 81, for example on the order of 100 to 1, transistor 77 remains off much longer than it is on. Thus, the off-to-on ratio is extremely large but yet the circuit will be periodically sampled to determine if the short existing between terminals 51 and 52 has terminated. Resistors 86 and 88 are chosen to establish a predetermined voltage level at terminal 52 which will cause cyclical operation of FET 77 so that a perfect short between terminals 51 and 52 will not be required to initiate the cyclical sampling operation.

Finally, if lamp 22 becomes extinguished, thus opening the circuit between terminals 65 and 66, transistor 67 will turn off causing the corresponding input to NAND gate 75 to go low raising the output of NAND gate 75 to turn on transistor 77 and energize the load which will, if it is an alarm, warn the operator that a malfunction has occurred.

The embodiments of the invention in which an exclusive property or right is claimed are defined as follows:

1. A protection circuit for a field effect transistor comprising:
   a field effect transistor having a gate and a drain-source circuit;
   drain-source connecting means for connecting said drain-source circuit to a load and a source of voltage;
   switch means having first and second inputs and output means, said first input receiving a command signal for energizing said field effect transistor;
   gate connecting means connecting said output of said switch means to said gate of said field effect transistor; and,
   oscillator means connected to said drain-source circuit and to said second input of said switch means for cyclically operating said field effect transistor when both the voltage on said drain-source circuit exceeds a predetermined value and said field effect transistor receives said command signal.

2. The circuit of claim 1 wherein said oscillator means comprises a timing circuit for determining the amount of on time and the amount of off time of said field effect transistor when said cyclical operation has been initiated.

3. The circuit of claim 2 wherein said oscillator means comprises voltage sensing means connected to said drain-source circuit for establishing the voltage to which said oscillator means responds.

4. The circuit of claim 3 wherein said oscillator means comprises responsive means connected to said timing means, to said voltage sensing means and to said second input of said switch means for turning off said field effect transistor when said field effect transistor has been turned on by a command signal and when said drain-source voltage exceeds said predetermined value, said timing means causing said field effect transistor to be reenergized after a predetermined time delay.

5. The circuit of claim 4 wherein said timing circuit comprises a parallel combination of a resistor connected in parallel to a series connected diode and resistor and a capacitor connected to said parallel combination and to said responsive means.

6. The circuit of claim 5 wherein said voltage sensing means comprises a transistor having a base, a collector and an emitter, means connecting said base to said drain-source circuit for establishing the voltage at which said transistor conducts, and means connecting said collector-emitter circuit of said transistor to said responsive means.

7. The circuit of claim 6 wherein said responsive means comprises a NAND gate having a first input connected to a junction of said parallel combination and said capacitor, a second input connected to said collector-emitter connecting means, and an output.

8. The circuit of claim 7 wherein said switch means comprises a NAND gate having a first input for receiving said command signal, a second input connected to the output of said NAND gate of said responsive means and output means connected to said timing circuit and to said gate of said field effect transistor.

* * * * *